United States Patent [19]

Bernardson

[11] Patent Number: 4,584,561
[45] Date of Patent: Apr. 22, 1986

[54] METHOD OF RESIDUE TO ANALOG CONVERSION

[75] Inventor: Peter S. Bernardson, Westchester, Penn.

[73] Assignee: GTE Communication Systems Corporation, Phoenix, Ariz.

[21] Appl. No.: 653,402

[22] Filed: Sep. 24, 1984

[51] Int. Cl.$^4$ .............................................. H03M 1/12
[52] U.S. Cl. ........................ 340/347 DA; 340/347 M; 364/746
[58] Field of Search ................ 340/347 DA; 235/311; 364/746

[56] References Cited

PUBLICATIONS

W. K. Jenkins, ICASSP 1978, pp. 804–807, "Residue-to-Analog Conversion".
F. J. Taylor et al., CAS 1981, pp. 1164–1169, "Residue-to-Decimal Converter"; IEEE Transactions.
M. A. Soderstrand et al., 1983 IEEE Trans. CAS-30, pp. 903–907, "RNS D/A Converter".
W. K. Jenkins, IEEE Trans. CAS, vol. 25, 1978, pp. 555–562, "Residue-to-Analog Conversion".
Arora et al., Procs. Fifth Symp. on Computer Arithmetic, "Conversion Scheme in Residue Code", 1981, 5/18–5/19.
M. A. Soderstrand et al., "ICAS 1984, pp. 1455–1458, "Pipelined IIR RNS Digital Filters".

Primary Examiner—William M. Shoop, Jr.
Assistant Examiner—Saul M. Bergmann
Attorney, Agent, or Firm—Russell A. Cannon

[57] ABSTRACT

In a residue number system defined by the moduli set $\{p1=2^n-1, p2=2^n, p3=2^n+1\}$, a method of converting residue numbers {m1,m2,m3} to associated analog signals r(m1,m2,m3) comprises the steps of selecting a first binary signal satisfying the relationships $|m1*S3+m3*S1|_{p1*p3}$ (where the constant $S1=p1*p2/2$ and $S3=p2*p3/2$) from a first look-up table; and summing the n less significant bits of this first digital signal and the negative of the residue digit signal m2 in a first binary adder for generating a second binary signal that is representative of the difference therebetween, taken modulo p2. This second binary signal addresses a second look-up table containing third binary signals which correspond to possible values of the product of the second binary signal and p1 and p3. Selected first and third binary signals are summed in a second binary adder for producing a binary output signal r(m1,m2,m3) that is representative of the residue number {m1,m2,m3}. This binary output signal is converted to a corresponding analog signal in a standard D/A converter. In an alternate method, 2n binary 0's are stuffed as less significant bits of the second binary signal prior to subtracting the latter from this bit shifted signal for producing the third binary signal. In yet another method, the first binary signal is obtained by selecting the binary signals m1*S3 and m3*S1 from associated look-up tables prior to summing them modulo p1*p3.

12 Claims, 20 Drawing Figures

```
r(m1,m2,m3)  0  1  2  3  4  5  6  7  8  9  10  11  12  13  14...55  56  57  58  59 m1   0  1  2  0  1  2  0  1  2  0   1   2   0   1   2.... 1   2   0   1   2 m2   0  1  2  3  0  1  2  3  0  1   2   3   0   1   2.... 3   0   1   2   3 m3   0  1  2  3  4  0  1  2  3  4   0   1   2   3   4.... 0   1   2   3   4
```

| n | $2^{2n}-1=$ | $R_{max}$ | k | $k(2^{2n}-1)$ | $\left\lvert (a+b)_{max}-1 \right\rvert_{2^{2n}-1}$ | $\dfrac{R_{max}-1}{2^{2n}-1}$ |
|---|---|---|---|---|---|---|
| 1 | 3 | 7 | 2 | 6 | 1 | 1.33 |
| 2 | 15 | 23 | 1 | 15 | 8 | 0.533 |
| 3 | 63 | 79 | 1 | 63 | 16 | 0.253 |
| 4 | 255 | 287 | 1 | 255 | 32 | 0.126 |
| 5 | 1023 | 1087 | 1 | 1023 | 64 | 0.0626 |

FIG. 4A level $m_2 = 0$

| $m_1 \downarrow$ / $m_3 \rightarrow$ | 0 | 1 | 2 | 3 | 4 |
|---|---|---|---|---|---|
| 0 | 0 | 36 | 12 | 43 | 14 |
| 1 | 40 | 16 | 52 | 29 | 4 |
| 2 | 20 | 50 | 32 | 3 | 44 |

FIG. 4B level $m_2 = 1$

| $m_1 \downarrow$ / $m_3 \rightarrow$ | 0 | 1 | 2 | 3 | 4 |
|---|---|---|---|---|---|
| 0 | 45 | 21 | 57 | 33 | 9 |
| 1 | 25 | 1 | 37 | 13 | 49 |
| 2 | 5 | 41 | 17 | 53 | 29 |

FIG. 4C level $m_2 = 2$

| $m_1 \downarrow$ / $m_3 \rightarrow$ | 0 | 1 | 2 | 3 | 4 |
|---|---|---|---|---|---|
| 0 | 30 | 6 | 42 | 18 | 54 |
| 1 | 10 | 46 | 22 | 53 | 34 |
| 2 | 50 | 26 | 2 | 38 | 14 |

FIG. 4D level $m_2 = 3$

| $m_1 \downarrow$ / $m_3 \rightarrow$ | 0 | 1 | 2 | 3 | 4 |
|---|---|---|---|---|---|
| 0 | 15 | 51 | 27 | 3 | 39 |
| 1 | 55 | 31 | 7 | 43 | 19 |
| 2 | 35 | 11 | 47 | 23 | 59 |

FIG. 5A level $m_2 = 0$

| $m_1 \downarrow$ / $m_3 \rightarrow$ | 0 | 1 | 2 | 3 | 4 |
|---|---|---|---|---|---|
| 0 | 0 + 0d | 6 + 2d | 12 + 0d | 3 + 3d | 9 + 1d |
| 1 | 10 + 2d | 1 + 1d | 7 + 3d | 13 + 1d | 4 + 0d |
| 2 | 5 + 1d | 11 + 3d | 2 + 2d | 8 + 0d | 14 + 2d |

FIG. 5B level $m_2 = 1$

| $m_1 \downarrow$ / $m_3 \rightarrow$ | 0 | 1 | 2 | 3 | 4 |
|---|---|---|---|---|---|
| 0 | 0 + 3d | 6 + 1d | 12 + 3d | 3 + 2d | 9 + 0d |
| 1 | 10 + 1d | 1 + 0d | 7 + 2d | 13 + 0d | 4 + 3d |
| 2 | 5 + 0d | 11 + 2d | 2 + 1d | 8 + 3d | 14 + 1d |

FIG. 5C level $m_2 = 2$

| $m_1 \downarrow$ / $m_3 \rightarrow$ | 0 | 1 | 2 | 3 | 4 |
|---|---|---|---|---|---|
| 0 | 0 + 2d | 6 + 0d | 12 + 2d | 3 + 1d | 9 + 3d |
| 1 | 10 + 0d | 1 + 3d | 7 + 1d | 13 + 3d | 4 + 2d |
| 2 | 5 + 3d | 11 + 1d | 2 + 0d | 8 + 2d | 14 + 0d |

FIG. 5D level $m_2 = 3$

| $m_1 \downarrow$ / $m_3 \rightarrow$ | 0 | 1 | 2 | 3 | 4 |
|---|---|---|---|---|---|
| 0 | 0 + 1d | 6 + 3d | 12 + 1d | 3 + 0d | 9 + 2d |
| 1 | 10 + 3d | 1 + 2d | 7 + 0d | 13 + 2d | 4 + 1d |
| 2 | 5 + 2d | 11 + 0d | 2 + 3d | 8 + 1d | 14 + 0d |

FIG. 7

| $m_1 \downarrow$ / $m_3 \rightarrow$ | 0 | 1 | 2 | 3 | 4 |
|---|---|---|---|---|---|
| 0 | 0 | 6 | 12 | 3 | 9 |
| 1 | 10 | 1 | 7 | 13 | 4 |
| 2 | 5 | 11 | 2 | 8 | 14 |

FIG. 6

| m2'(m2) | NEW VALUES | $m_2=0$ | $m_2=1$ | $m_2=2$ | $m_2=3$ |
|---|---|---|---|---|---|
| 0 = ⟨4⟩₄ = ⟨8⟩₄ = ⟨12⟩₄ | | 0d | 3d | 2d | 1d |
| 1 = ⟨5⟩₄ = ⟨9⟩₄ = ⟨13⟩₄ | | 1d | 0d | 3d | 2d |
| 2 = ⟨6⟩₄ = ⟨10⟩₄ = ⟨14⟩₄ | | 2d | 1d | 0d | 3d |
| 3 = ⟨7⟩₄ = ⟨11⟩₄ = ⟨15⟩₄ | | 3d | 2d | 1d | 0d |

METHOD OF RESIDUE TO ANALOG CONVERSION

RELATED APPLICATIONS

This invention relates to patent applications Ser. No. 653,422 filed Sept. 24, 1984, Ser. No. 653,423 filed Sept. 24, 1984, and Ser. No. 653,412 filed Sept. 24, 1984.

BACKGROUND OF INVENTION

This invention relates to the residue number system (RNS) and more particularly to improved method for converting residue number signals to binary number signals which are readily converted to analog representations of decimal number signals.

It is becoming increasingly popular to design electrical equipment such as filters, CODECS and echo cancellers to perform necessary processing functions in a digital manner in order to obtain the advantages of high reliability and reproducibility of results. This requires converting an analog input signal to a digital signal, performing the necessary processing operations on the digital signal in a digital manner, and then translating the processed digital signal back into an associated analog output signal. In a digital filtering operation, for example, a series of multiplications and a long summation of product terms may be required. Since there are carries involved with basic arithmetic operations such as multiplication and addition in weighted number systems such as the decimal and binary (base 10 and base 2) number systems, time is required to accommodate all of the necessary carry operations. By way of example, there is a single carry from the units column to the 10's column when adding the numbers 9 and 5 to get the number 14 in the base 10 number system. This also applies to multiplication. And where 2 each 16 digit numbers are multiplied together to obtain a 32 digit number, it may be necessary to propagate a carry from the least significant digit in the units column all the way up to the last digit that corresponds to the most significant digit. This can be very time consuming. One technique for overcoming this time limitation that is called pipelining involves generation, in the same time, of different future product (or addition) terms corresponding to different bits and delaying them accordingly, so that all bits of a result will appear on outputs at the same time. This normally requires considerable hardware which can be costly in terms of both economics and real estate in an integrated circuit structure. Another technique for overcoming this time limitation is to perform such operations as multiplication and addition in a non-weighted number system which is called the residue number system (RNS). A residue signal processor has advantage over a conventional binary-digital processor in that results are exact, a smaller amount of hardware is required, shallower pipelining is possible, operation time may be decreased, and no carries are involved.

During recent years there has been considerable interest in and development of techniques for performing digital computing and digital signal processing with hardware based on the RNS. This interest stems at least partially from the fact that operations can be performed quickly in the RNS because of the separability of operations on each RNS digit and the elimination of carries. Residue signal processor means must sample analog input signals and convert the samples to residue signals, perform the necessary processing on the residue signals, and convert the resultant residue signals back to analog output signals. Although techniques are readily available for efficiently converting analog/decimal or binary/digital signals to residue number signals, it is much more difficult to convert residue number signals back into analog signals. Since the RNS is not a weighted number system, its direct conversion to decimal/analog is not practical. One approach is to convert residue number signals to digital/binary signals and use one of the well known digital to analog conversion schemes to obtain the requisite analog/decimal signals.

Residue to analog conversion is described in the articles:

"Techniques for Residue-to-Analog Conversion for High Data Rate Digital Filtering" by W. K. Jenkins, 1978 IEEE International Conference on Acoustics, Speech and Signal Processing, pages 804–807;

"An Efficient Residue-to-Decimal Converter" by F. J. Taylor and A. S. Ramnarayanan, IEEE Transactions on Circuits and Systems, Vol. 28, No. 12, December 1981, pages 1164–1169;

"An Improved Residue Number System Digital-to-Analog Converter" by M. A. Soderstrand, et al, IEEE Transactions on Circuits and Systems, Vol. 30, No. 12, December 1983, pages 903–907; and "Techniques for Residue-to-Analog Conversion for Residue-Encoded Digital Filters" by W. K. Jenkins, IEEE Transactions on Circuits and Systems, Vol. 25, No. 7, July 1978, pages 555–562.

Prior art residue to binary/digital converters generally require considerable hardware and/or have relatively slow execution times and/or require considerable surface area, which is undesirable in an integrated circuit structure or implementation. Also, many of the prior art residue to analog converters require memories that store look-up tables and/or modulo adders, both of which are generally hardware intensive, slow in terms of overall execution time and/or are magnitude limited in that memory size dictates the maximum number of bits and thus the largest number that can be handled. The execution time of RNS to binary converters which require memory is normally dictated by the access time of the memory, (i.e., the time that it takes to obtain information from a memory location) which may be for CMOS ROMS in the order of 100 nanoseconds. Memory systems having much shorter execution times are very expensive and are even more magnitude limited (i.e., memories with short execution times normally have fewer bytes of memory). Stated differently, memories having larger storage capacity normally have longer execution times and require considerably more real estate, which is a disadvantage in an integrated circuit structure. This can be a significant limitation since the advantages of the RNS increase with the number of bits of memory that are available. By way of example, multiplication of 2 each n-bit numbers is n times faster in the RNS than in the binary number system without pipelining. Additionally, modulo adders are normally more complex than and require more surface area in integrated circuit implementations than do conventional binary adders.

An object of this invention is the provision of improved method and apparatus for converting residue number signals to binary number signals.

SUMMARY OF INVENTION

In accordance with this invention, a method of converting a binary representation of a residue signal {m1,m2,m3} in a prescribed residue number system that is defined by the moduli set {p1=$2^n-1$, p2=$2^n$, p3=$2^n+1$}, where n is an integer, to an associated binary output signal r(m1,m2,m3), comprises the steps of first producing a first digital signal that is a binary representation of the sum of the product term m1*S3 and m3*S1, the sum being taken modulo p1*p3, where S1=(p1*p2)/2 and S3=(p2*p3)/2; second producing a second signal that is a binary representation of the difference between binary bits of the first signal and the binary representation of the residue signal m2, the difference being taken modulo p2; third producing a third signal that is a binary signal representation of the product of the second signal and the constants p1 and p3; and first summing the first and third signals for producing the binary output signal r(m1,m2,m3) that is associated with the residue signal {m1,m2,m3}.

DESCRIPTION OF DRAWINGS

This invention will be more fully understood from the following detailed descriptions of preferred embodiments thereof, together with the drawings in which:

FIGS. 4A–4D are tabulations of combinations of values of m1 and m3 in FIG. 3 for m2=0, 1, 2, and 3, respectively.

FIGS. 5A–5D are alternate representations of associated FIGS. 4A–4D.

FIG. 6 is a tabulation which summarizes the contents of FIGS. 5A–5D.

FIG. 7 is a mapping table which summarizes the information in FIGS. 5A–5D.

Figures 1, 2, 3, 12:
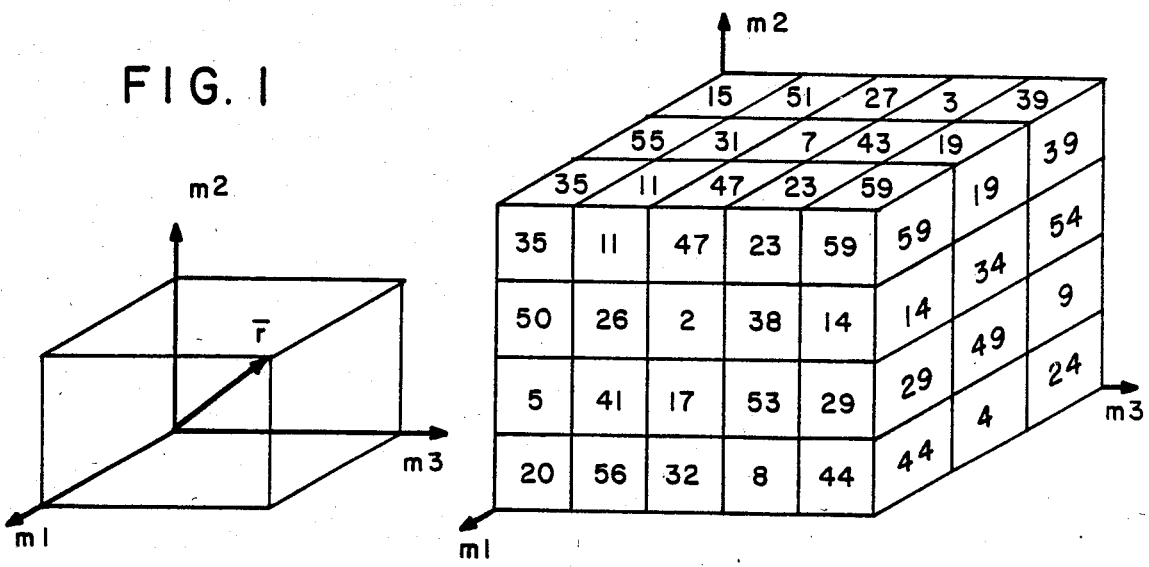
FIG. 1 is a diagrammatic representation of a 3-dimensional RNS signal vector r̄(m1,m2,m3).
FIG. 2 is a tabulation of values of residue digits m1, m2, and m3 of the signal vector in FIG. 1 which define associated decimal numbers 0 through 59 for a prescribed RNS.
FIG. 3 is a diagramatic representation of a sectionalized cube illustrating values of the residue digits defining the prescribed RNS signal vector in FIG. 1 for the prescribed RNS.
FIG. 12 is a tabulation of values of various terms in equations (25)–(32).

The circled numerals in ones of the figures designate equations defining signals on associated lines.

DESCRIPTION OF PREFERRED EMBODIMENTS

Residue arithmetic and residue number systems are defined in the literature such as "Residue Arithmetic and Its Applications to Computer Technology" by N. S. Szabo and R. I. Tanaka, McGraw Hill Book Company; "The Residue Number System" by H. L. Garner, IRE Transactions on Electronic Computers, June 1959, pages 140-147; and "A Survey of Modern Algebra" by G. Birkhoff and S. MacLane, the McMillan Company. Residue number systems are of particular interest in digital signal processing.

Each designated or selected or prescribed RNS is essentially defined by an N-tuple moduli set P that is representable as $$P = \{p1, p2, pi, \ldots, pN\} \quad (1)$$

where i has integer values from 1 to N and each pi designates a particular modulus. The modulus may be thought of as being similar to the base b of the binary and decimal weighted number systems where b=2 and b=10, respectively. In these weighted number systems, a carry may be propagated between columns and must be taken into consideration in defining the value of the number.

The residue representation of a natural or decimal number X in a selected RNS is a sequence of integer residue digits and takes the form of an N-tuple $$X = \{m1, m2, mi, \ldots, mN\} \quad (2)$$

where the residue number or digit mi is $$mi = |X|_{pi} \quad (3)$$

is the ith residue of X modulo pi and pi is the ith modulus in the selected RNS. Stated differently, mi is the smallest or least positive integer residue or remainder after X is divided by pi (i.e., X/pi). By way of example, if X=13 and pi=2, then $$mi = |13|_2 = X - pi*[X/pi] = 1 \quad (4)$$

where * designates multiplication and [ ] designates the integer value (i.e., 6 in this example) of the quotient X/pi=13/2. Stated differently, 13 divided by 2 is 6 plus a smallest integer remainder of mi=1. If all of the moduli pi are relatively prime, there is a unique representation for each decimal number X in the range $$0 \leq X \leq \left( \prod_{i=1}^{N} pi = M \right) \quad (5)$$

where π designates an arbitrary product; N is the number of the modulus in a prescribed or selected or designated RNS; and M is the product of all of the moduli in the selected RNS, is one more than the largest decimal number X that can be uniquely represented in the selected RNS, and is referred to as the dynamic range of the selected RNS.

The prime integers Q are those that are divisable only by ±1 and ±Q. The relatively prime integers are those integers that have no non-trivial common divisors. Thus, the set of relatively prime integers includes, but is not limited to, the set of prime integers. By way of example, 10 and 14 are not relatively prime since both numbers are divisable by 2 (which is not a trivial divisor), but 3 and 14 are relatively prime numbers. Two other important operations or functions in the RNS are congruence which is represented by the symbol ≃ here, and the multiplicative inverse which is represented by the symbol = in a modulo ratio. Two integers R and S are said to be congruent modulo pi if they differ only by an integral multiple of pi. Thus, 7 and 19 are congruent modulo 12 since they differ by 12. This congruence is expressed as 7≃19 modulo 12. This is expressed more generally as R≃S modulo p which holds if and only if p|(R−S) which means that R−S is divisable by p, that R−S is in the set of all multiples of p, and that R and S leave the same least integer remainders when they are divided by p. Also, G is the multiplicative inverse of H modulo p, which is designated as $$G = \left| \frac{1}{H} \right|_p \quad (6)$$

$$\left| \left| \frac{1}{H} \right|_p * H \right|_p = 1 \quad (7)$$

if $0 \leq G \leq p$ and $|GH|_p = 1$. Algebraic and arithmetic in the RNS are described in the open literature.

A well known single moduli RNS, in which the modulus $p=12$, is the number system that is used to keep track of time (hours) on a clock which only displays hours in integer values. In such a system, the face of the clock might show 10 minutes past both 11 A.M. and 11 P.M. as 11:10. Similarly, it would show 10 minutes past both 1 A.M. and 1 P.M. as 1:10. In such an RNS where time starts at midnight on day one, the clock registers 12:00, then 1:00, 2:00, . . . 11:00. These times are, of course, A.M. But at noon and thereafter of day one, the clock again registers or repeats the number sequence 12:00, 1:00, 2:00, etc. There is no indication, however, as to whether time is A.M. or P.M. and there is no carry operation when the clock runs out of unique numerals at 11 and starts counting over again with 12:00. And when day two arrives, the clock again repeats the sequence of residue number digits without taking into account a carry. This is a particular advantage of the RNS in that there are no carry operations which require time to implement. There may, however, be carries between bits in digital (binary) representations of residue digits. There are no carries between residue digits. Representations in the so-called military time in which a day has 24 hours are readily converted to residue digits in the previously described modulo 12 number system by a simple modulo operation of dividing the military time (in hours) by the number 12 and taking the remainder. Thus, when 13:00, 15:00 and 23:00 hours in military time are divided by 12, the normal representations of time are found to be the well known remainders of 1:00, 3:00, and 11:00 O'clock, respectively.

A particular RNS is selected by designating a particular moduli set (1) for defining the residue digits in (2) and FIG. 2. The invention here is restricted to an RNS defined by a 3-tuple moduli set of the form $$P = \{p1, p2, p3\} = \{2^n - 1, 2^n, 2^n + 1\} \quad (8)$$

where n is an integer, $p1 \neq p2 \neq p3$, and the 3 moduli may occur in any order and for any n. This RNS has gained much popularity in signal processing since residue numbers in it can be efficiently scaled by any one of the chosen modulus, (i.e., divided by those moduli. The corresponding residue representation of the natural or decimal integer number X (which can be represented in binary form) is then $$X = \{x1, x2, x3\} = \{m1, m2, m3\} \quad (9)$$

For purposes of illustration only, the variable n has a value of 2 here such that $p1=3$, $p2=4$, and $p3=5$ (see equation (8)) and $M=60=p1*p2*p3$. This means that the largest decimal integer number that can be uniquely expressed in this particular selected RNS where $n=2$ is 59 (i.e., $M-1$). Also, each modulus (i.e., 3, 4 and 5) defines the period for the associated residue digits (see FIG. 2). The residue digits m1, m2, and m3 are ordinary decimal numbers expressed in binary form. The residue digits m1, m2 and m3 are defined by 2, 2 and 3 bits, respectively, for $n=2$.

In this 3-tuple RNS, the 3 digit residue number for each decimal equivalent may be represented as the 3-dimensional discrete vector $\bar{r}(m1,m2,m3)$ as is shown in FIG. 1. The decimal numbers and associated sets of residue numbers or digits in this 3 moduli RNS are tabulated in FIG. 2. It is readily seen that this vector $\bar{r}(m1,m2,m3)$ has 60 possible values (the dynamic range of this RNS with $n=2$), where each value of the vector may be represented as a unit cube as is shown in FIG. 3. The architecture or makeup of the large cube in FIG. 3 is more clearly seen by slicing it with cuts that are parallel to the m1-m3 plane in FIG. 3 as is illustrated in FIGS. 4A-4D for the four possible residue digit values $m2=0, 1, 2,$ and 3. These tabulations can be simplified by rewriting them in modulo $p1*p3=$ modulo 15 form as is shown in FIGS. 5A-5D. Consideration of the representations there and the modulo $p2=4$ values of the modulo $p1*p3$ remainders there (i.e., 0, 6, 12, 3, 9 for $m1=m2=0$ and $m3=0$ through 4) reveals that decimal numbers in squares of these four FIGS. 5A-5D satisfy the representations in FIG. 6 such that the four FIGS. 5A-5D may be represented by a single mapping in FIG. 7 containing only the modulo $p1*p3$ remainders in FIGS. 5A-5D. This is accomplished by realizing that addition constants 0d, 1d, 2d and 3d are congruent modulo $p2=4$ to the remainder values above them in these tables multiplied by the constant $d=p1*p3=15$ and by utilizing substitutions from FIG. 6. Thus, these four tables in FIGS. 5A-5D reduce to the single FIG. 7 which contains all of the information necessary to uniquely describe the mapping between decimal numbers X and the corresponding-selected 3-moduli set of RNS numbers. Consideration of the mapping table in FIG. 7 reveals that in general a two dimensional m1, m3 structure is described here with values following a well ordered diagonal pattern such that for a prescribed two dimensional RNS ($p1=2^n-1$ and $p3=2^n+1$), the decimal number value $r(m1,m3)$ can be expressed as $$r(m1,m3) = \left| \left( m1 * \left| \frac{1}{p1} \right|_{p3} * p3 \right) + \right. \quad (10)$$

$$\left. \left( m3 * \left| \frac{1}{p3} \right|_{p1} * p1 \right) \right|_{p1*p3}$$

$$= \left| \left( m1 * \left| \frac{1}{2^n - 1} \right|_{2^n+1} * (2^n + 1) \right) + \right. \quad (11)$$

$$\left. \left( m3 * \left| \frac{1}{2^n + 1} \right|_{2^n-1} * (2^n - 1) \right) \right|_{2^{2n}-1}$$

$$= |m1 * s3 + m3 * s1|_{p1*p3} \quad (12)$$

-continued $$= \left| \frac{m1 * (2^n) * (2^n + 1)}{2} + \frac{m3 * (2^n - 1) * (2^n)}{2} \right|_{2^{2n}-1} \quad (13)$$

$$= |2^{n-1} * (2^n * (m1 + m3) + (m1 - m3))|_{2^{2n}-1} \quad (14)$$

$$= |(2^{2n-1} * (m1 + m3)) + (2^{n-1} * (m1 - m3))|_{2^{2n}-1} \quad (15)$$

since $p1 * p3 = 2^{2n} - 1$ and $\quad (16)$ $$\left| \frac{1}{2^n - 1} \right|_{2^n+1} = \left| \frac{1}{2^n + 1} \right|_{2^n-1} = 2^{n-1} \quad (17)$$

The requisite three dimensional mapping is obtained by adding an appropriate constant S2 which accomplishes the substitution of FIG. 6 and which is defined as $$S2 = m2'(m2) * p1 * p3 \quad (18)$$
$$= (2^{2n} - 1) * m2'(m2) \quad (19)$$
where
$$m2'(m2) = ||r(m1,m3)|_{p2} - m2|_{p2} \quad (20)$$
$$= (r(m1,m3))_{nlsb} - m2)_{nlsb} \quad (21)$$
so that
$$S2 = (2^{2n} - 1) * (r(m1,m3)_{nlsb} - m2)_{nlsb} \quad (22)$$
$$\quad (23)$$
$$= 2^{2n}(r(m1,m3)_{nlsb} - m2)_{nlsb} - (r(m1,m3)_{nlsb} - m2)_{nlsb}$$

where nlsb designates the n less significant bits and m2'(m2) is an element of the set (0,p2−1)=(0,3) in the example here where n=2. The values of m2'(m2) are shown in FIG. 6 for the selected RNS in this example where n=2. The desired three dimensional representation of a decimal number may therefore be expressed as $$r(m1,m2,m3) = r(m1,m3) + S2 \quad (24)$$

Figure 8:
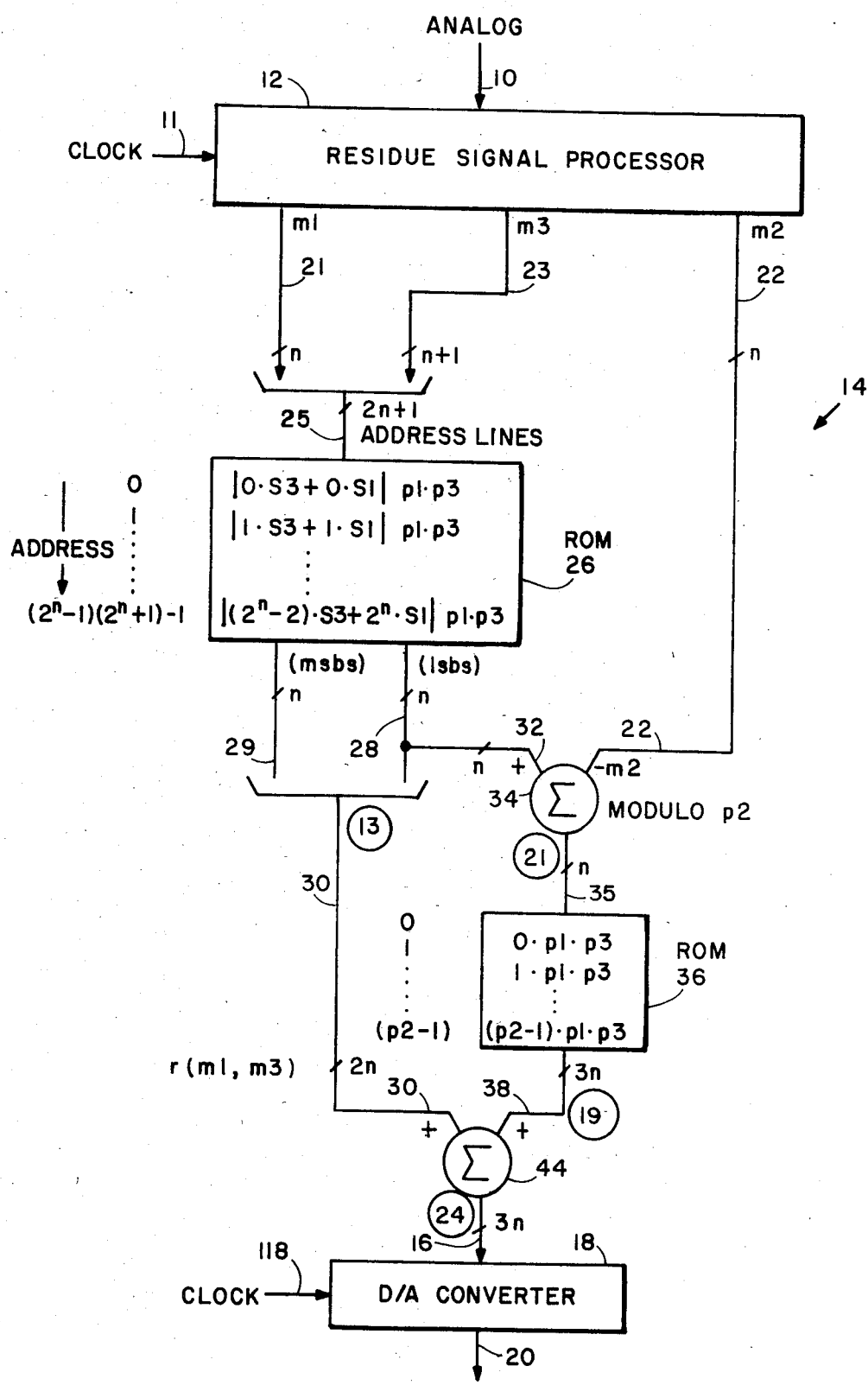
FIG. 8 is a schematic circuit diagram of signal processor circuitry including a medium moduli RNS to binary converter 14 that requires only a pair of memory devices and binary adders.

Referring now to FIG. 8, an analog signal on line 10 is applied to a residue signal processor 12 which produces unique digital signals on pluralities of output lines 21, 22 and 23. Each of these digital signals defines a binary number designating an associated one of the residue digits m1, m2 and m3 of residue numbers in the selected RNS. The residue number represented or defined by m1,m2 and m3 is applied to the residue to binary converter 14 embodying this invention which converts it to a binary signal on lines 16. This is signal converted back to an associated analog signal by the D/A converter 18.

The processor 12 here typically comprises a circuit for sampling the analog signal, in response to a clock signal on line 11, at a prescribed rate as is well known in the art. The analog samples are converted to representative residue number signals in an analog to residue converter and are then operated on to accomplish some prescribed function such as digital filtering, with the resultant digital residue signal being defined by the residue number digit signals m1, m2 and m3 on lines 21-23. The residue digits m1 and m2 are defined by n=2 (in this example) binary bits on associates pairs of lines 21 and 22. The residue digit m3 requires n+1=3 lines since the modulus $p3 = 2^n + 1 = 5$ here, and 3 bits are required to represent the maximum number 4 (for a modulo 5) in a binary representation. This invention is directed to improved method and apparatus for converting the residue number signals on lines 21-23 back to an associated binary and/or analog signal.

The residue to binary converter 14 comprises a pair of memory devices 26 and 36 which may be read only memories (ROMs) and a pair of binary adders 34 and 44 which may be standard binary adders. ROM 26 contains a look-up table for effectively performing multiplication of m1 and m3 by associated constants S3 and S1, and addition modulo p1*p3=15 of associated product signals as is specified by equation (12). Individual memory locations are addressed by the residue digits m1 and m3 which are combined on lines 25 to make up a single 2n+1 bit digital address word. The ROM 26 requires at least p1*p3=15 memory locations, each being 2n=4 bits long where n=2, for storing all possible values of r(m1,m2) as given by equation (12). The output signal of ROM 26 is a 2n=4 bit word defining the two dimensional vector representation r(m1, m3) of the binary equivalent of the residue number {m1,m2,m3}, where lines 28 contain the n less significant bits and lines 29 contain the n more significant bits thereof, and the 2n lines 30 contain the combined signals on lines 28 and 29. The two dimensional digital output signal r(m1, m3) on lines 30 is applied to one input of binary adder 44. The correction signal S2 must be generated and applied to the other input terminal of adder 44 in order to produce an output signal on lines 16 which satisfies the equation (24).

Recognizing that the n less significant bits of r(m1,m3) on lines 28 and 32 correspond to r(m1,m2) modulo $p2 = 2^n$ in equation (20), this signal is applied on lines 32 to the binary adder 34 which takes the difference between it and m2. And by ignoring any overflow of carries in the adder 34, which corresponds to taking only the n less significant bits of this difference signal, it operates as a modulo $p2 = 2^n$ adder for producing the requisite n- bit digital output signal on the n lines 35 which corresponds to the term m2'(m2) in equations (20)-(21).

The ROM 36 contains a look-up table for effectively multiplying the variable m2'(m2) on lines 35 by the constants p1 and p3, i.e., by $2^{2n} - 1$, as is required by equation (18). Individual memory locations are addressed by the $p2 = 2^n = 4$ possible binary values of m2'(m2). Thus, the ROM 36 requires at least $p2 = 2^n = 4$ each (3n=6 bit long) memory locations, where n=2, for storing all possible values of m2'(m2) here. The resultant digital signal on the 3n lines 38 corresponds to the constant S2 in equations (18) and (19) and is applied to the other input of the binary adder 44 which sums them. Although a standard binary adder 44 here normally has 3n+1 lines, to take care of any overflow (carry), it can be shown that this binary adder 44 will never overflow. This means that adder 44 may be implemented with simplified-custom circuitry. Alternatively, excess MSB lines on the output of a standard binary adder 44 may be ignored. This also holds true for binary adders in circuits of other figures here. The digital output signal of adder 44 is a 3n bit binary number corresponding to the residue number m1,m2,m3 on input lines 21-23 and satisfying equation (24). The corresponding analog signal is obtained on line 20 with a conventional D/A converter 18.

Although this residue to binary converter 14 requires memory elements, it has particular advantage in that the adders are all conventional binary adders which are relatively straightforward to design and implement and which are relatively fast. The limitation on speed here is dictated by the access time of the memories. The memories also require considerably more surface area of an integrated circuit chip than do binary adders. Currently the practical limit for implementing a single integrated circuit residue to binary converter 14 is for n=6. Then the size of ROM 36 is 49,152 bits, which is possible to implement with a 64k bit ROM. The binary adders 34 and 44 are then 6 bit and 18 bit devices. The period $M=p1*p2*p3$ for this converter is $M=63*64*65=262,080\doteq2^{18}$ so that the largest decimal number that can be represented by the residue numbers for n=6 is 262,079. (For a 3n=36 bit converter 14 (where n=12), the requisite memory size for the ROM 26 is approximately $2^{24}\times24=400$ megabits, which is not practical to implement in most applications.) By pipelining all of the hardware blocks the conversion time of the converter 14 may be shortened to the slowest blocks execution time.

Alternatively, ROMs having greater than 64k of memory may be employed as smaller IC geometries become available. This allows n to be larger and thus the period to be increased. By way of example, with a 256k ROM (where 229,362 bits are actually needed), n can be increased to 7 so that the total period is increased to $2,097,024\simeq2^{21}$. Also, a pair of ROMs (not shown) may be substituted for the single ROM 26, with each ROM of the pair storing one of the m1*S3 and m3*S1 product terms. Each ROM of the pair is addressed by the associated one of the residue signals m1 and m3. The output signals of the two ROMs are combined in a modulo p1*p3 adder for producing the requisite signal defined by equations (10)–(15). This allows n to be larger and the total period M to be increased. By way of example, with a pair of 64k ROMs employed in place of the single ROM 26, n may be as large as 10 which provides a total period M of approximately $2^{30}\simeq10,737,418*10^2$. This implementation does, however, require additional surface area of an integrated circuit semiconductor chip which is undesirable in integrated electronic circuits.

Figure 9:
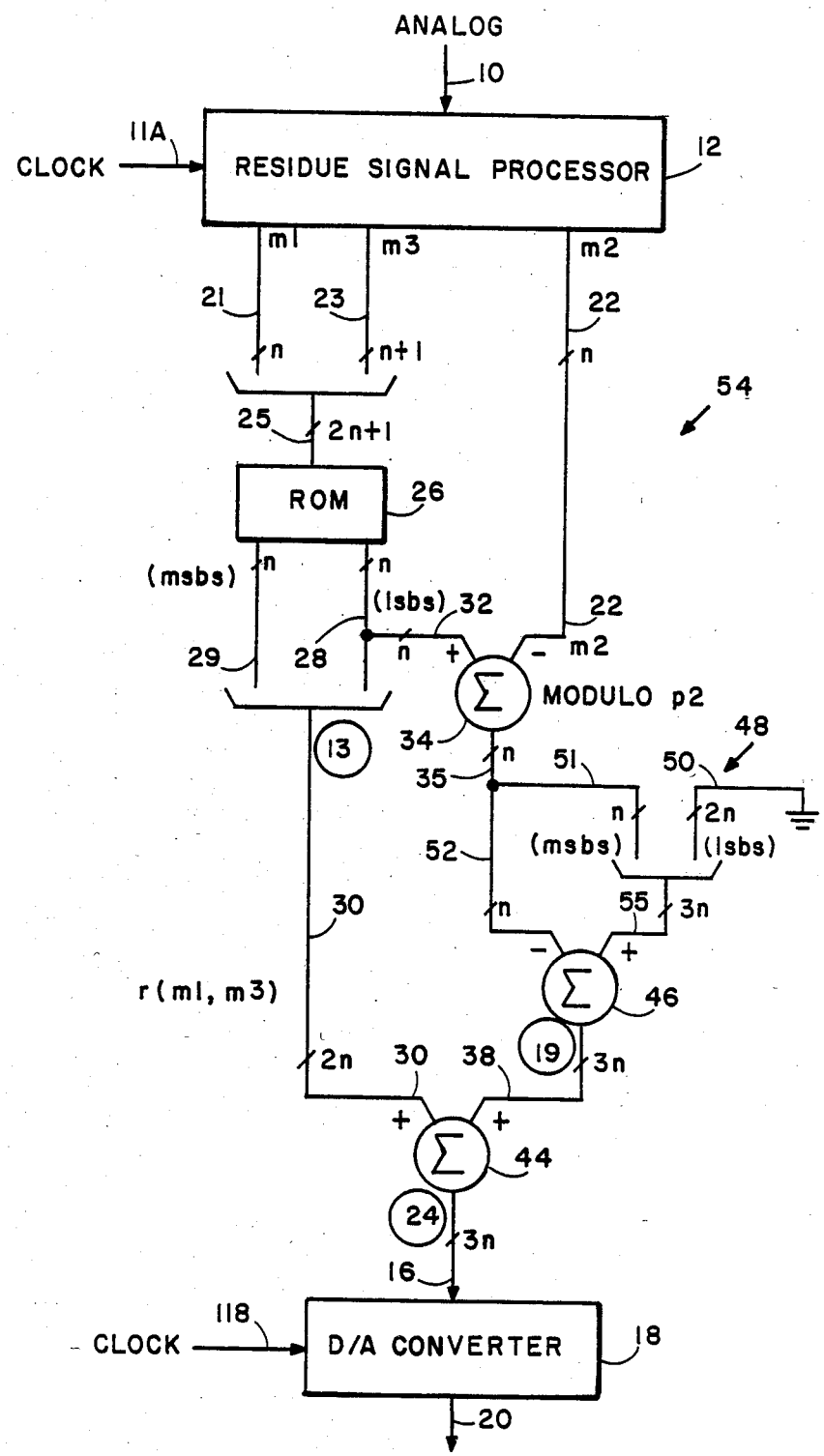
FIG. 9 is a schematic circuit diagram of an alternate embodiment 54 of the converter 14 in FIG. 8 that requires only a single memory device and binary adders.

An alternate embodiment of this invention in which the second ROM 36 is replaced by a conventional binary adder 46 and a bit shift means 48 is illustrated in FIG. 9. As stated previously, the adder 34 produces a digital signal on lines 35 satisfying the relationship (21) which must be multiplied by the constant $p1*p3=2^{2n}-1$. The ROM 36 satisfies the prescribed multiplication operation. These same operations are accomplished in FIG. 9 with elements 46–48 where the circuit arrangement 48 connects 2n lines 50 to ground and combines or inserts the binary 0 bits on these lines 50 as less significant bits with the digital signal on lines 35 from the adder 34. This essentially shifts the binary signal on lines 35 by 2n bits which corresponds to a multiplication by $2^{2n}$. The n bit binary signal on lines 35 is applied to the difference input terminal of adder 46. In this way the n bit signal on lines 35 is then subtracted from the bit shifted product signal on the 3n lines 55 to produce the desired binary signal on lines 38 which satisfies the equations (18)–(19). The output signal of adder 46 is completely contained in the 3n output lines 38 since there is no overflow in adder 46 in this example.

Figure 10:
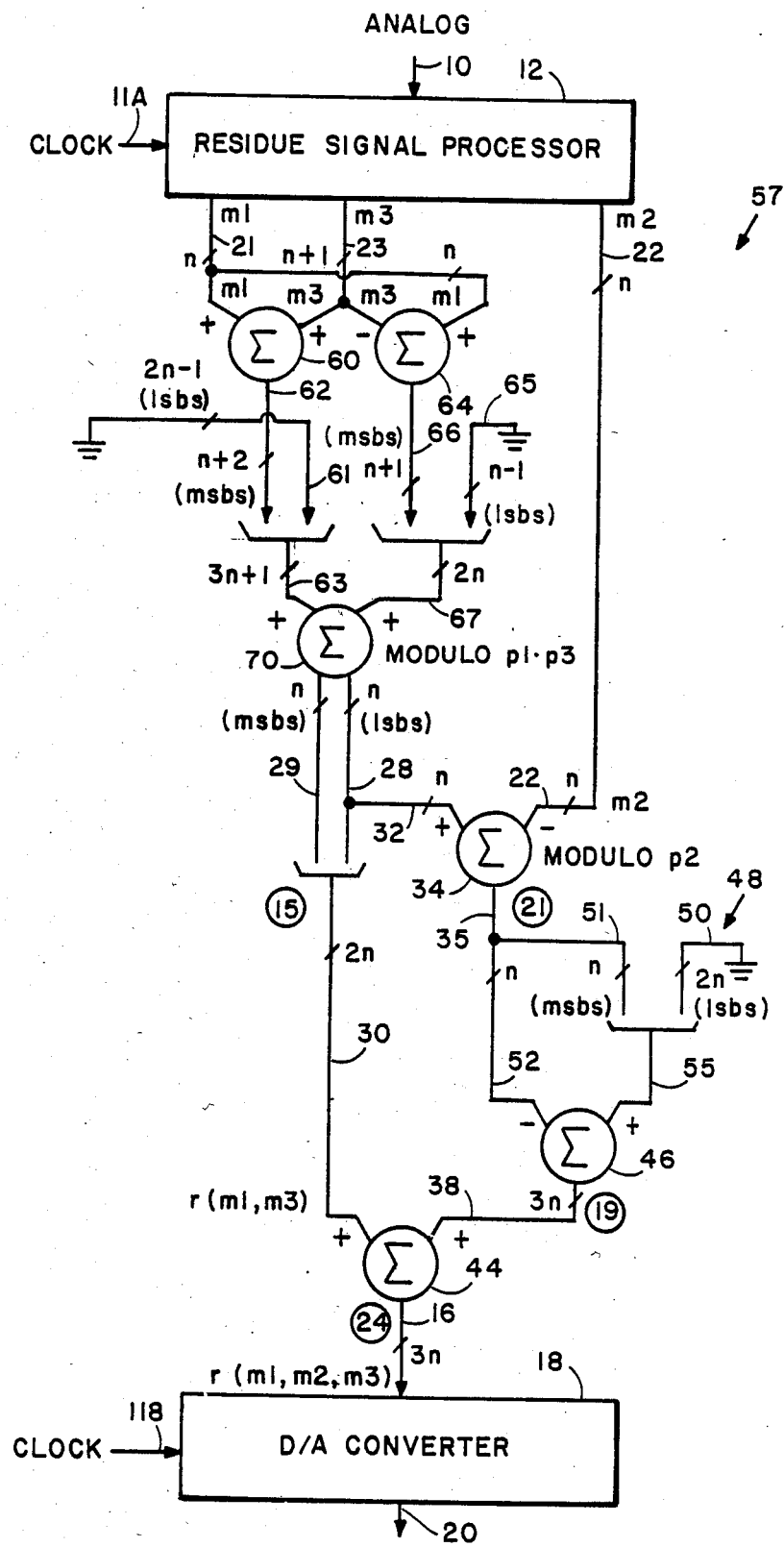
FIG. 10 is a large moduli memoryless converter 57 which is an alternate embodiment of the converter 54 in FIG. 9 and which employs a modulo adder.
Figure 11:
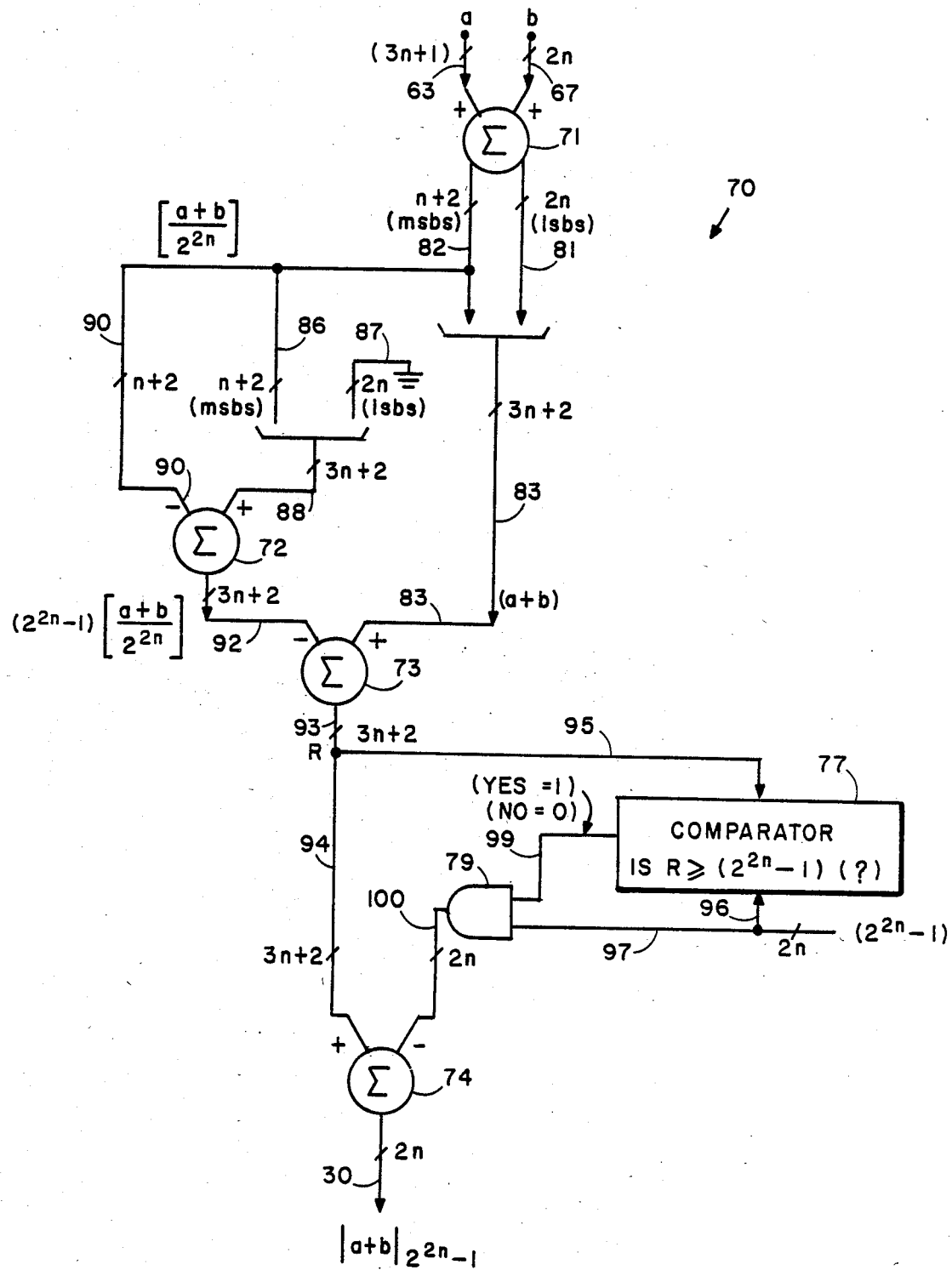
FIG. 11 is a schematic circuit diagram of a modulo adder 70 which has particular utility in the converter 57 in FIG. 10 for providing a large moduli memoryless converter in which the adders are all binary adders.

A preferred embodiment of this invention which does not require any memory devices is illustrated in FIG. 10. Recognizing that equation (14) can be rewritten as equation (15) reveals that the two dimensional residue signal r(m1,m3) may be obtained by multiplying the sum and difference of m1 and m3 by powers of two and combining them modulo p1*p3. The desired sum and difference signals are obtained with binary adders 60 and 64 which may be implemented with less than the standard n+2 binary output bits where it is confirmed that there will be no overflow produced during operation thereof. Otherwise standard binary adders here take into account any overflow resulting from an internally generated carry operation. If the adders 60 and 64 employ more output lines than are actually required to define the output signal thereof, ones of the more significant bits thereof are merely stuffed with binary 0's so that they are effectively ignored or out of the circuit. The desired multiplications are accomplished in FIG. 10 by connecting 2n−1 lines 61 and n−1 lines 65 to ground and inserting the binary 0 bits on these lines as the less significant bits of the binary signals on lines 62 and 66 from the adders 60 and 64, respectively. This bit shifting of the output signals of the adders gives binary signals on the 3n+1 and 2n lines 63 and 67 which represent the 2 terms within equation (15). These signals are summed in a modulo $p1*p3=2^{2n}-1$ adder 70 to provide a binary signal on the 2n lines 28 and 29 which is the signal r(m1,m3) and which satisfies the relationship (15). This circuit 70 is a true modulo adder. The limit on the size of the converter 57 in FIG. 10 is imposed by the 3n bit binary adders 44 and 46 (at the bottom of FIG. 10) and any such elements of the circuit 70. The conversion time, which is determined by the longest delay in the circuit, is also determined by the 3n bit adders 44 and 46. This converter 57 is extremely fast and is not magnitude limited by memory size and therefore has a wide fixed point dynamic range M. Also, conversion speed may be traded for hardware (i.e., chip area), and vice versa. Additionally, if the adders are pipelined, then even shorter operation times are obtainable, although the penalty of increased price and size for additional circuitry is entailed. Additionally, the modulo adder 70 may be implemented with standard or custom designed binary adders which are relatively simple and straightforward to design and implement. In accordance with another aspect of this invention, a modulo $2^{2n}-1$ adder 70 comprising only adders that are binary adders (71–74), a comparator circuit 77 and an AND circuit 79 is illustrated in FIG. 11.

Consideration of the operation of the modulo adder 70 in FIG. 10 as defined by equation (15) reveals that the latter is of the form $$|S|_W = S - W*[S/W] \qquad (25.1)$$

which can be written as $$|S|_W = S - W*\left[\frac{S}{W}\right] \qquad (25.1)$$

$$|a+b|_{2^{2n}-1} = (a+b) - (2^{2n}-1)*\left[\frac{a+b}{2^{2n}-1}\right] \qquad (25.2)$$

and $$|a+b|_W = (a+b) - W*\left[\frac{a+b}{W}\right] \qquad (25.3)$$

where $|S|_W$ designates the number S taken modulo W, $S=a+b$, a and b are the first and second terms in equation (15), $W=2^{2n}-1$ and [ ] denotes the integer part of the enclosed quantity. Equation (25.2) states that the quantity (a+b) taken modulo ($2^{2n}-1$) is equal to the difference between (a+b) and the product of $2^{2n}-1$) and the integer part of (a+b)/($2^{2n}-1$). Since it is easier to implement a division operation in hardware by powers of 2 that involve only a shift towards the least significant bit, equation (25.3) can be rewritten as $$|a+b|_W = (a+b) - W * \left( \left[ \frac{a+b}{W+1} \right] + k \right) \quad (25.4)$$

$$= (a+b) - W * \left[ \frac{a+b}{W+1} \right] - W*k \quad (25.5)$$

which may be rewritten as $$|a+b|_{2^{2n}-1} = (a+b) - (2^{2n}-1) * \left[ \frac{a+b}{2^{2n}} \right] - k*(2^{2n}-1) \quad (26.1)$$

This is possible because $$\left[ \frac{a+b}{W} \right] = \left[ \frac{a+b}{W+1} \right] + k \quad (26.2)$$

where k is a positive integer. Substituting $$R = (a+b) - W * \left[ \frac{a+b}{W+1} \right] \quad (26.3)$$

into equation (26.1) one gets $$|(a+b)|_W = R - k*W \quad (26.4)$$

$$= R - k*(2^{2n}-1) \quad (27)$$

$$= R - 2^{2n}*k + k \quad (28)$$

where $$R = (a+b) - (2^{2n}-1) * \left[ \frac{a+b}{2^{2n}} \right] \quad (29)$$

Omitting the quantity $-1$ in the denominator of equation (25.2) so as to only divide by $2^{2n}$ means to disregard the 2n less significant bits of the term in the [ ] in equation (26.1) and the last term in equation (26.1) compensates for this modification of the designation of the integer part. The term k is a constant where k=0,1,2, . . . and is dependent on the value of R. The value of k dictates the number of comparisons required in the circuit of FIG. 11 as is described more fully hereinafter. The k term will now be evaluated.

For the selected RNS system where $p1=2^n-1$, $p2=2^n$, and $p3=2^n+1$, it will be recognized that $(a+b)_{max}=2^{3n}+1$, where $a_{max}$ and $b_{max}$ are dictated by the number of wires in lines 63 and 67 in FIGS. 10–11. The maximum value of R is obtained for one less than the quantity $(a+b)_{max}$ so that $R_{max}$ is representable as $$R_{max} = (a+b)_{max} - 1 - (2^{2n}-1) * \left[ \frac{(a+b)_{max} - 1}{2^{2n}} \right] \quad (30)$$

$$= 2^{3n+1} + 2^{2n} - 1 - (2^{2n}-1) * \left[ \frac{2^{3n+1} + 2^{2n} - 1}{2^{2n}} \right] \quad (31)$$

$$= 2^{2n} + 2^{n+1} - 1 \quad (32)$$

And since $|a+b|_{2^{2n}-1}$ must, by definition, be less than $2^{2n}-1$ (the modulo), then it follows that equation (27) must be less than the modulus. This is expressed mathematically as $$(|a+b|_{2^{2n}-1} = R - k(2^{2n}-1)) < (2^{2n}-1) \quad (33)$$

By subtracting the modulus and adding k times the modulus to each side of equation (33), the expression $$(R - (2^{2n}-1)) < k(2^{2n}-1) \quad (34)$$

is obtained. Now dividing both sides of equation (34) by the modulus (which modulus here is taken as greater than 0), one obtains the expression $$k > \left( \frac{R}{2^{2n}-1} - 1 \right) \quad (35)$$

which shows that $R_{max}$ dictates the max value of k which here is $$k_{max} > \frac{2^{n+1}}{2^{2n}-1} \quad (36)$$

Values of various ones of the terms in equations (25)–(32) as a function of the number of bits n are illustrated in FIG. 12. The value of k for $n>1$ is conveniently representable by the relationships $$k = \begin{cases} 0 \text{ for } R < (2^{2n}-1) \\ 1 \text{ for } R \geq (2^{2n}-1) \end{cases} \quad (37)$$

here. For the trivial case where n=1, the modulus $2^{2n}-1$ is 3 and the value of k is 2. This modulo adder in FIG. 11 has the advantages that it uses only adders that are binary adders, requires no memories, can be made to operate for very large n's on a single IC chip, and all adders can be built as pipelined adders for increased speed of operation.

An alternate evaluation of the k term and the maximum value thereof will now be presented. From the definition of an RNS representation it is known that $$|S|_W \overset{!}{>} W \quad (38)$$

since S can only take on values from 0 to W−1 and the exclamation point means "by definition." Therefore equation (26.4) can be written as $$|(a+b)|_W = R - k*W < W \quad (39)$$

or $$R - W < k*W \quad (40)$$

Since W is $>0$, both sides of equation (40) can be divided by W without changing the inequality sign, i.e., $$\left(\frac{R}{W} - 1\right) < k; k > \frac{R}{W} - 1 \tag{41}$$

This states that the smallest possible value of k (which must be an integer) must be larger than the R, which corresponds to a given (a+b) as expressed by equation (26.3) divided by modulo W from which 1 is subtracted. Since k must be an integer it follows from equation (41) that the smallest possible value of k is $$k = \left[\frac{R}{W} - 1\right] + 1 \tag{42}$$

since k must be an integer. By substituting R from the equation (26.3) into equation (42) then equation (42) becomes $$k = \left[\frac{a+b}{W} - \left[\frac{a+b}{W+1}\right] - 1\right] + 1 \tag{43}$$

where [ ] denotes the integer part of the quantity therein. It will be remembered that R here is a function of both a and b and thus k is a function of these variables.

The quantity R is given by equation (26.3) and can be rewritten as $$R = a + b - W * \left[\frac{a+b}{W+1}\right] = a + b - W * I \tag{44}$$

where $$I = \left[\frac{a+b}{W+1}\right] = \left[\frac{a+b}{2^{2n}}\right] \tag{45}$$

Since the largest I occurs for $(a+b)_{max}$, then $$I_{max} = \left[\frac{(a+b)_{max}}{2^{2n}}\right] = \left[\frac{a_{max} + b_{max}}{2^{2n}}\right] \tag{46}$$

In the example in FIG. 10 a on line 63 has $3n+1$ bits and b on line 67 has $2^n$ bits.
Thus $$a_{max} = 2^{3n+1} \tag{47}$$

$$b_{max} = 2^{2n} \tag{48}$$

Substituting these values of $a_{max}$ and $b_{max}$ into equation (46) then $$I_{max} = \left[\frac{(2^{3n+1} + 2^{2n})}{2^{2n}}\right] = [2^{n+1} + 1] = 2^{n+1} + 1 \tag{49}$$

Consideration of equations (49) and (44) reveals that R is maximum for (a+b) as large as possible and the product $W*I$ being as small as possible. The choice of $a_{max}$ and $b_{max}$ gives $I_{max}$, and hence $W*I_{max}$. It is now necessary to find $R_{max}$.

If a and b are chosen such that $(a+b)/2^{2n}$ in equation (45) is less than it is for their maximum values of $2^{3n+1}+2^{2n}$ then the integer part I will be $I_{max}-1$. In the example here this reduces to $$\left[\frac{2^{3n+1} + 2^{2n}}{2^{2n}} - \frac{1}{2^{2n}}\right] = I_{max} - 1 = I1 \tag{50}$$

It should be remembered here that the integer part of a quantity is obtained by truncating digits following the decimal point (e.g., [2.01]=[2.999]=2). With this choice for a and b then $$(a+b)_{I1} = (a+b)I_{max} - 1 = a_{max} + b_{max} - 1 \tag{51}$$

and $$W*I1 = W*(I_{max} - 1) = W*I_{max} - W \tag{52}$$

This means that the positive part of equation (44) is only 1 less than the maximum and the negative part of equation (44) is W less than the maximum. Hence, from equation (44) one obtains $$R_{max} = a_{max} + b_{max} - 1 - W*(I_{max} - 1) \tag{53}$$
$$= a_{max} + b_{max} - 1 + W - W*I_{max}$$

Substituting in equation (53) from equations (47), (48) and (49) gives $$R_{max} = 2^{2n} + 2^{n+1} - 1 \tag{54}$$

in this instance.
Substituting this value of $R_{max}$ in equation (41) than $$k_{max} > \frac{R_{max}}{W} - 1 = \frac{2^{n+1}}{2^{2n} - 1} \tag{55}$$

And since $k_{max}$ must be an integer it follows that the smallest possible $k_{max}$ is $$k_{max} = \left[\frac{2^{n+1}}{2^{2n} - 1}\right] + 1 \tag{56}$$

where again the braces denote an integer part. Again, the $k_{max}$ gives the number of needed comparators in the figures.

Referring now to FIG. 11, the digital signals a and b (which correspond to the first and second terms in equation (15)) on the $3n+1$ and $2n$ lines 63 and 67 are combined in the binary adder 71 which takes into consideration any overflow caused by a carry that is generated during operation thereof. The output of adder 71 is comprised of 2n less significant bits and n+2 more significant bits on associated pluralities of lines 81 and 82, respectively, which are combined on the $3n+2$ lines 83. This signal on lines 83 corresponds to the first term on the right in equation (26.1). The n+2 more significant bits on lines 86 corresponds to the integer value of $(a+b)/2^{2n}$ and are shifted by 2n less significant bits by the lines 87 which have one ends thereof connected to ground for impressing binary 0's thereon. The bit shifted signal on lines 88 corresponds to one of the products in the middle term in equation (26.1) and is applied to one input of the second binary adder 72 which can be shown to never overflow in this example. The n+2 more significant bits on line 90 in the output of the first adder, which also correspond to the integer value of (a+b) divided by $2^{2n}$, are applied to the second or difference input of the binary adder 72. The difference signal from adder 72 is an output signal on the 3n+2 lines 92 which satisfies the other product in the middle term in equation (26.1). The digital signals on lines 83 and 92 are combined in the third binary adder 73, which can also be shown to never overflow in this example, for producing the difference signal R that is defined by equation (29) on the 3n+2 lines 93. This output signal of the binary adder 73 is applied directly to one input of the fourth binary adder circuit 74 and to one input of comparator circuit 77.

The comparator circuit 77 has a binary representation of the constant $(2^{2n}-1)$ applied to the other input 96 thereof and to the gate circuit 79. The circuit 77 is conventional and may be readily implemented with NAND, NOR and inverting gates. The comparator circuit 77 is operative for producing a binary 1 or 0 on line 99 for enabling and disabling the gate circuit 79 when $R \geq 2^{2n}-1$ and $R < 2^{2n}-1$, respectively. The gate circuit 79 is responsive to the binary signal on line 99, which corresponds to the constant k, for selectively passing the 2n bit binary signal on lines 97 to the other input of the fourth binary adder 74. The difference signal generated on the 2n least significant bit output lines 30 of the binary adder 74 is the desired modulo $(2^{2n}-1)$ output signal defined by the equations (26.1) and (27). Recognizing that the digital signals a and b correspond to the signals on lines 63 and 67 in FIG. 10, it is seen that the output signal on lines 30 in FIG. 11 corresponds to the two dimensional signal r(m1,m3) defined by equation (15) and generated on line 30 in FIG. 10. This modulo adder 70 has particular advantage in that it uses only adders that are binary adders, requires no memories, can be made to operate for very large n's on a single IC chip, and all adders can be built as pipelined adders for increased speed of operation.

Figure 13:
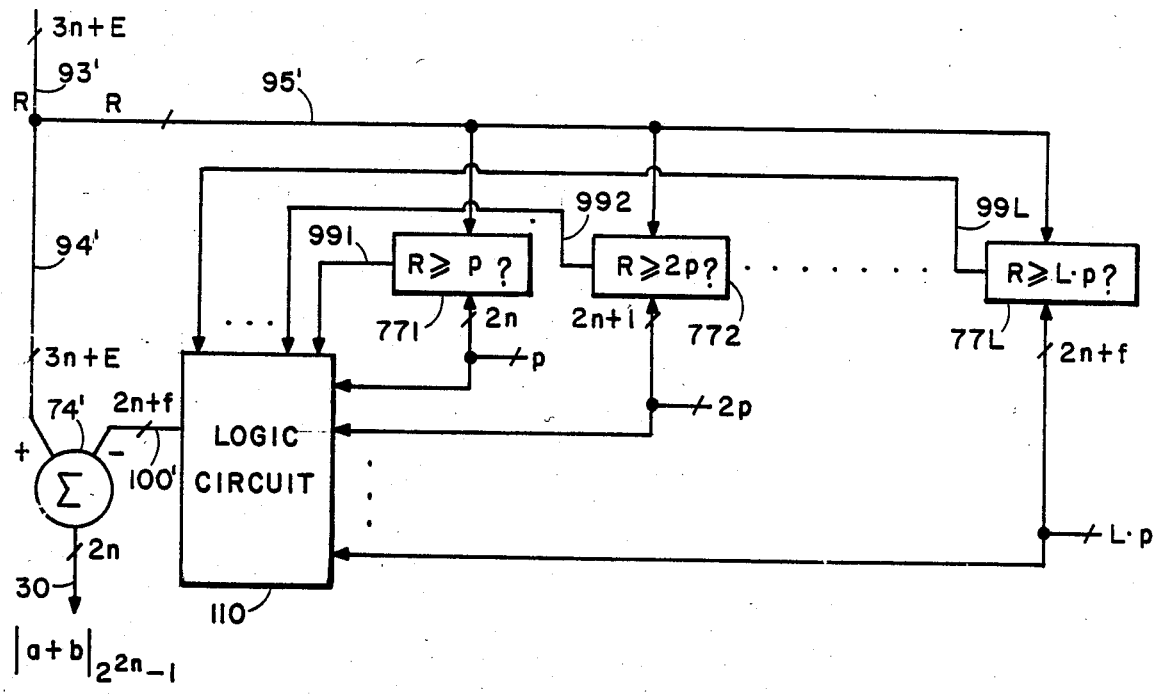
FIGS. 13 and 14 are schematic circuit diagrams illustrating alternate embodiments of circuitry in FIG. 11.

When the limits on a+b in FIG. 11 are much higher than $2^{3n+1}$ plus $2^{2n}$, for n=1, then k is greater than one and a plurality of comparisons are required. An alternate embodiment of the modulo $p=p1^*p3=2^{2n}-1$ adder in FIG. 11 which performs L comparisons for $k \leq L$ is illustrated in FIG. 13. In this circuit, if the value of R on line 95' is less than p then the binary outputs of all of the comparators 771-77L are a binary 0 on lines 991-99L which disables logic circuit 110 so that all binary 0's are outputted on lines 100'. If $3p > R \geq 2p$, for example, then binary ones on only lines 991 and 992 from only the comparators 771 and 772 enable circuit 110 so that it produces on lines 100' a digital signal in binary form that corresponds to the constant 2p and which is applied to the difference input terminal of adder 74' for producing the desired binary number signal corresponding to a+b modulo $(2^{2n}-1)$.

Figure 14:
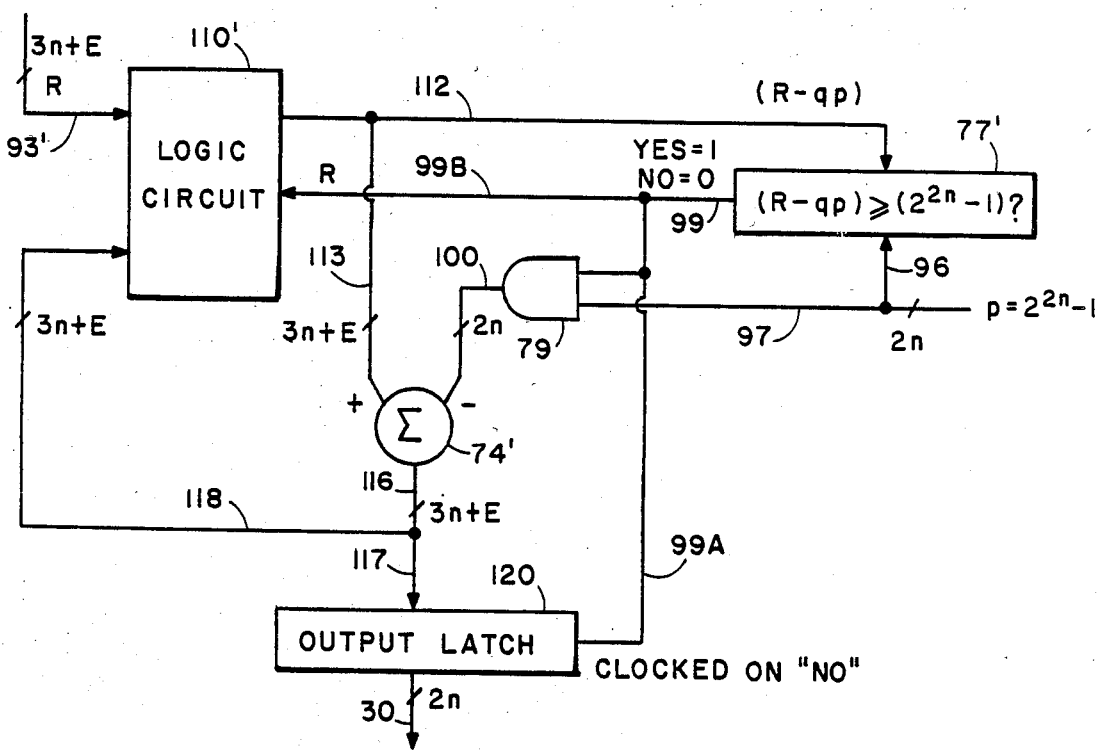

Another embodiment of the modulo $p=p1^*p3=2^{2n}-1$ adder in FIG. 11 for k>1 is illustrated in FIG. 14. In this circuit, a logic circuit 110' sequentially applies a signal (R-qp), where q is an integer which may be 0, on line 112 until comparator 77' provides a binary 0 output signal on line 99 which indicates that the current value of (R-qp) on line 112 is less than $p=2^{2n}-1$. The example where $3p > R \geq 2p$ will now be considered. Initially, logic 110' receives the signal R on line 93' and passes it on line 112 (where q=0) to comparator 77'. Since the current value of the signal on line 112 is greater than $(2^{2n}-1)$, the output of comparator 77' on line 99 is a binary one which enables gate 79. This causes gate 79 to pass on line 100 the binary representation of the constant $(2^{2n}-1)$ which is subtracted from the signal R on line 113 in the binary adder 74. The difference signal from adder 74 is applied to an output latch 120 and the logic circuit 110'. Since the latch 120 is disabled by the output signal of comparator 77', this output signal of adder 74 is not passed to line 30 as the modulo p1*p3 output signal thereof. The logic circuit 110' is responsive to the binary one from the comparator for applying this output signal (R-qp=R-p) of adder 74 to lines 112 and 113. Since this signal on line 112 is still greater than the modulus p1*p3 on line 96 for this example, another binary one from the comparator enables gate 79 for passing the constant p1*p3 to the difference input of the binary adder, disables the output latch 120 for blocking the output signal of the adder, and enables the logic circuit 110' for again passing the output signal of the binary adder to lines 112 and 113. Since this new output signal of the logic circuit corresponds to (R-2p), the comparator 77' now produces a binary 0 on line 99 which indicates that the current digital input signal is less than the modulus p1*p3 signal on line 96. This logic 0 on line 99 causes gate 79 to block the constant on line 97 and apply binary 0's to the difference input terminal of the binary adder 74, enables latch 120 for passing the output signal of the binary adder, and disables logic circuit 110' for blocking the output signal of the binary adder on line 118 from line 112. This binary output signal of the adder 74 corresponds to the signal (R-2p), the 2n less significant bits of which are passed by the latch 120 for providing the desired modulo p1*p3 signal on line 30.

Although this invention is described in relation to preferred embodiments thereof, variations and modifications thereof are possible. By way of example, the operation time of the residue to binary converters and the modulo adder may be decreased by pipelining various ones of the adders and/or memory devices, and by employing time shared and/or carry-look ahead binary adders. Also, various ones of the adders and/or memory devices of the converters and modulo adder may be clocked in a manner which is well known in the art, although this is not essential to the operation thereof. The scope of this invention is therefore to be determined from the appended claims rather than from the aforementioned detailed descriptions of preferred embodiments thereof.

Typically, n is positive and is between 7 and 12 for a medium moduli RNS here. The value of n may be greater than 12 for a large moduli RNS here.

What is claimed is:
1. The method of converting a binary representation of a residue signal {m1,m2,m3} in a prescribed residue number system that is defined by the moduli set {$p1=2^n-1$, $p2=2^n$, $p3=2^n+1$}, where n is an integer, to an associated binary output signal r(m1,m2,m3), said method comprising the steps of:
   first producing a first digital signal that is a binary representation of the sum of the product terms m1*S3 and m3*S1, the sum being taken modulo p1*p3, where S1=(p1*p2)/2 and S3=(p2*p3)/2;
   second producing a second signal that is a binary representation of the difference between binary bits of the first signal and the binary representation of the residue signal m2, the difference between taken modulo p2;
   third producing a third signal that is a binary signal representation of the product of the second signal and the constants p1 and p3; and first summing the first and third signals for producing the binary output signal r(m1,m2,m3) that is associated with the residue signal {m1,m2,m3}.

2. The method according to claim 1 wherein said first summing step is accomplished with a first binary adder circuit.

3. The method according to claim 2 wherein said second producing step takes into consideration the n less significant bits of the first signal, which is the modulo p1*p3 signal.

4. The method according to claim 3 wherein said second producing step is accomplished with a second binary adder circuit which operates as a modulo $2^n$ modulo adder.

5. The method according to claim 4 wherein said third producing step comprises the steps of:
storing a look-up table of values of the products of p1, p3 and possible values of the second signal in associated memory locations of a first memory device;
addressing a prescribed memory location of the first memory device with the second signal; and
outputting the third signal from the addressed memory location.

6. The method according to claim 4 wherein said third producing step comprises the steps of:
inserting 2n binary 0's as the less significant bits ahead of bits in the second signal for producing a bit shifted signal; and
second summing the bit shifted signal and the negative of the second signal for producing a difference signal which corresponds to the third signal.

7. Apparatus according to claim 6 wherein said second summing step is accomplished with a third binary adder circuit.

8. Apparatus according to claim 4 wherein said first producing step comprises the steps of:
storing a look-up table of modulo p1*p3 sums of the possible values of the m1*S3 and M3*S1 product terms in associated memory locations of a first memory device;
addressing a prescribed memory location of the first memory device with the residue signals m1 and m3; and
outputting the first signal from the addressed memory location of the first memory device.

9. The method according to claim 4 wherein said first producing step comprises the steps of:
storing first and second look-up tables of the products m1*S3 and m3*S1 in associated memory locations of associated first and second memory devices;
addressing prescribed memory locations of the first and second look-up tables with associated residue signals m1 and m3;
outputting the prescribed signals from the prescribed memory locations; and
third summing the two each outputted-prescribed product signals modulo p1*p3 for generating a signal corresponding to the first signal.

10. The method according to claim 8 wherein said third producing step comprises the steps of:
storing a look-up table of values of the products of p1, p3 and possible values of the second signal in associated memory locations of a second memory device;
addressing a prescribed memory location of the second memory device with the second signal; and
outputting the third signal from the addressed memory location.

11. The method according to claim 9 wherein said third producing step comprises the steps of:
inserting 2n binary 0's as the less significant bits ahead of bits in the second signal for producing a bit shifted signal; and
second summing the bit shifted signal and the negative of the second signal for producing a difference signal which corresponds to the third signal.

12. The method according to claim 11 wherein said second summing step is accomplished with a binary adder.

* * * * *